United States Patent
Hu

(10) Patent No.: US 9,362,813 B2
(45) Date of Patent: Jun. 7, 2016

(54) CONTROLLER AND A METHOD FOR CONTROLLING A PROCESS VARIABLE AND A POWER SUPPLY CIRCUIT COMPRISING A POWER SUPPLY AND A CONTROLLER

(71) Applicant: Intel Deutschland GmbH, Neubiberg (DE)

(72) Inventor: Jiawen Hu, Taufkirchen (DE)

(73) Assignee: Intel Deutschland GmbH, Neubiberg (DE)

( * ) Notice: Subject to any disclaimer, the term of this patent is extended or adjusted under 35 U.S.C. 154(b) by 64 days.

(21) Appl. No.: 14/472,010

(22) Filed: Aug. 28, 2014

(65) Prior Publication Data

US 2015/0061610 A1    Mar. 5, 2015

(30) Foreign Application Priority Data

Aug. 30, 2013  (DE) .......................... 10 2013 109 441

(51) Int. Cl.
| | |
|---|---|
| *H02M 1/00* | (2006.01) |
| *H02M 3/157* | (2006.01) |
| *H03F 1/02* | (2006.01) |
| *H03F 3/195* | (2006.01) |
| *H03F 3/24* | (2006.01) |

(52) U.S. Cl.
CPC ................ *H02M 1/00* (2013.01); *H02M 3/157* (2013.01); *H03F 1/0233* (2013.01); *H03F 3/195* (2013.01); *H03F 3/24* (2013.01); *H02M 2001/0003* (2013.01); *H02M 2001/0083* (2013.01); *H03F 2200/462* (2013.01); *Y02B 70/1425* (2013.01)

(58) Field of Classification Search
CPC ............. H02M 2001/0003; H02M 2001/0083; H02M 3/156; H02M 3/1588; H03G 3/3042; H03G 7/02; H03G 3/004; G05F 1/62; G05F 1/56; G05F 1/575

USPC ................... 323/234, 280, 284; 330/127, 132
See application file for complete search history.

(56) References Cited

U.S. PATENT DOCUMENTS

| | | | | | |
|---|---|---|---|---|---|
| 5,653,906 | A | * | 8/1997 | Fowler ................... | H05B 6/666 219/702 |
| 6,360,090 | B1 | * | 3/2002 | Holcombe ........... | H04B 10/114 348/189 |
| 6,541,948 | B1 | * | 4/2003 | Wong ...................... | G06F 1/575 323/222 |
| 6,552,606 | B1 | | 4/2003 | Veltman et al. | |
| 6,696,898 | B1 | * | 2/2004 | Ward .................. | H01F 17/0006 257/E27.046 |

(Continued)

FOREIGN PATENT DOCUMENTS

| | | |
|---|---|---|
| DE | 102005057768 A1 | 6/2007 |
| GB | 2463880 A | 3/2010 |

*Primary Examiner* — Adolf Berhane
(74) *Attorney, Agent, or Firm* — Schwegman Lundberg & Woessner, P.A.

(57) ABSTRACT

A controller (100; 200) for controlling a process variable (202) comprises an input interface (102) configured to receive a feedback signal indicative of an error between a process variable (202) to be controlled and a setpoint (104) for the process variable. At least a first integrator is (108) configured to derive an accumulated error signal using an integrator input signal depending on the feedback signal and at least one resonator having a predetermined resonance frequency is configured to provide a resonator output signal using a resonator input signal depending on the feedback signal. An output interface is (130) configured to provide a manipulation signal for influencing the process variable (202), the manipulation signal being derived using the accumulated error signal and the resonator output signal.

17 Claims, 9 Drawing Sheets

(56) References Cited

U.S. PATENT DOCUMENTS

| | | | |
|---|---|---|---|
| 7,944,716 B2 * | 5/2011 | Halberstadt | H02M 3/3376 315/291 |
| 2001/0003433 A1 * | 6/2001 | Hu | H03F 1/52 330/132 |
| 2002/0136325 A1 * | 9/2002 | Pehlke | H03F 1/0222 375/300 |
| 2003/0020544 A1 * | 1/2003 | Behzad | H01F 17/0006 330/254 |
| 2007/0139240 A1 | 6/2007 | Mitteregger et al. | |
| 2007/0176691 A1 * | 8/2007 | Batchelor | H03L 1/026 331/16 |
| 2008/0001585 A1 * | 1/2008 | Bakkaloglu | H03F 1/086 323/280 |
| 2011/0156940 A1 | 6/2011 | Le Guillou et al. | |
| 2013/0050892 A1 * | 2/2013 | Kuthi | H01J 37/321 361/234 |
| 2013/0214862 A1 * | 8/2013 | Presti | H03F 3/24 330/151 |

\* cited by examiner

CONTROLLER AND A METHOD FOR CONTROLLING A PROCESS VARIABLE AND A POWER SUPPLY CIRCUIT COMPRISING A POWER SUPPLY AND A CONTROLLER

PRIORITY APPLICATION

This application claims the benefit of priority to German Application No. 102013109441.4, filed Aug. 30, 2013, which is incorporated herein by reference in its entirety.

TECHNICAL FIELD

Examples described herein relate to controllers for controlling a process variable and to methods for controlling a process variable.

BACKGROUND

Applications requiring a controller for controlling a process variable are various. For example, a closed-loop controller may be used to control the output voltage of a power supply used to power a power amplifier. The current drawn by the power amplifier relates to its present input/output power which changes dynamically and therefore has a wideband spectrum. The alternating current, in turn, modulates the output voltage of the power supply since its output impedance is not indefinitely low. In order to avoid an undesirable drop of output voltages, controllers, e.g. closed-loop controllers, may be used to dynamically control the output voltage provided by the power supply. In order to avoid introduction of additional noise into the output signal provided by a power amplifier, e.g. a mobile communication Radio Frequency (RF) amplifier, power supplies should have low impedance in the bands where low noise is required or noise components introduced by the power supplies should be cancelled within those bands.

BRIEF DESCRIPTION OF THE DRAWINGS

Some examples of apparatuses and/or methods will be described in the following by way of example only, and with reference to the accompanying figures, in which.

DETAILED DESCRIPTION

Figure 1:
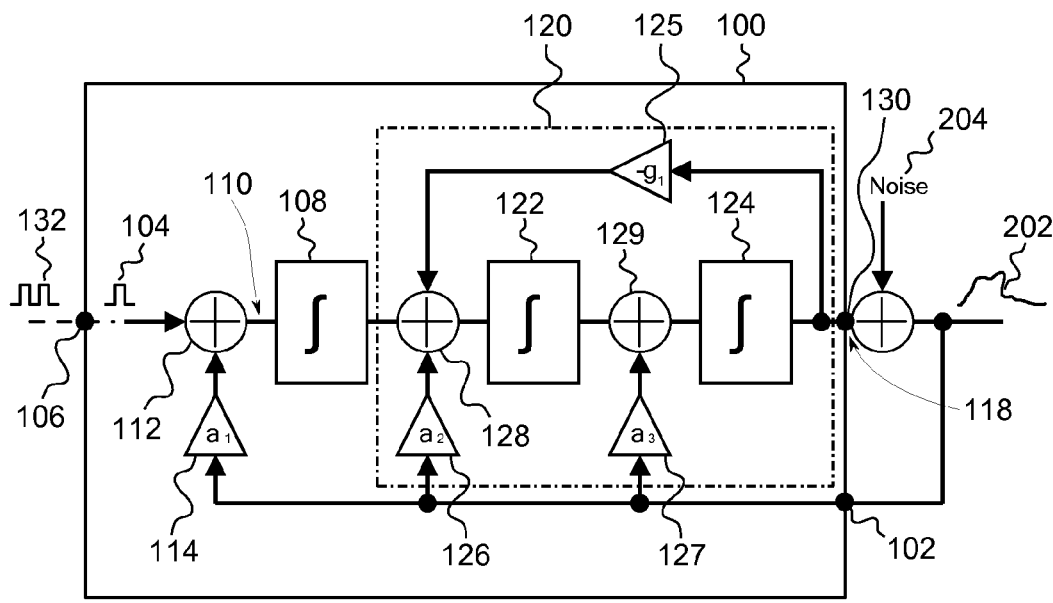
FIG. 1 shows an example of a controller for controlling a process variable.

Various example examples will now be described more fully with reference to the accompanying drawings in which some example examples are illustrated. In the figures, the thicknesses of lines, layers and/or regions may be exaggerated for clarity.

Accordingly, while example examples are capable of various modifications and alternative forms, examples thereof are shown by way of example in the figures and will herein be described in detail. It should be understood, however, that there is no intent to limit example examples to the particular forms disclosed, but on the contrary, example examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of example examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

In the following, some examples of controllers for controlling a process variable or quantity which is generated or output by a further device are discussed. Those applications are various. For example, envelope tracking radio frequency (RF) power amplifiers in mobile devices such as cell phones may require a power supply tracking the instantaneous output power of the power amplifier (PA). Those RF power amplifiers may be the most power-consuming components in a mobile device. In order to decrease power consumption, envelope tracking may be employed, which relies on adjustable power supplies for the power amplifiers having a high efficiency. A power supply efficiency of, for example, 85% and beyond may be desirable as well as at least twice the transmitting bandwidth and a low-noise floor at a pre-defined spectral distance to the carrier frequency or the transmission band. Further, power supplies for providing an operating voltage or power to the power amplifiers should be cost-effective and small in size when they are to be used in mobile devices.

In order to save power, an envelope signal may be provided which specifies the minimum acceptable yet sufficient amount of output power. The envelope signal may, e.g., be provided by base stations of a mobile telecommunications network or by some internal logic of a mobile device itself. Power supplies of power amplifiers in mobile devices are, therefore, often controlled by a controller in order to ensure that the desired envelope is followed by the present output of the power amplifiers with high accuracy. However, noise generated by the power supply or the controller itself couples directly from the power supplies to the radio frequency amplifiers so that the power supplies themselves should also be low noise at certain pre-defined bands given by the particular specification to be fulfilled so that the transmitter as a whole fulfills the desired spectral compliance. Just as an example, in Long-Term Evolution (LTE) mobile networks, the noise level shall be very low at a spectral distance from, for instance, 30 MHz to 400 MHz with respect to the carrier frequency where the receiver band is located.

There is a desire to provide solutions for controlling process variables with low noise characteristics.

Examples of controllers for controlling a process variable may achieve a low noise level at a particular predetermined frequency of the controlled process variable by incorporating a resonator with a predetermined resonance frequency as an element within the controller, e.g. within its control-loop.

FIG. 1 shows an example of a controller 100 for controlling a process variable. For the purpose of a better understanding of the controller, FIG. 1 substitutes a device to be controlled by the controller by means of a noise source 204 so as to be able to focus on the noise characteristics of the controller and on its noise suppression capabilities. The generated noise superimposes to the process variable 202 to be controlled by means of the controller 100. A particular example of a process variable 202 would be a supply voltage for a radio frequency amplifier or for any other power-consuming device. The controller 100 comprises an input interface 102 adapted to receive a feedback signal indicative of an error between the process variable to be controlled and a set point for the process variable. In this particular implementation, the feedback signal is provided by a copy of the generated process variable itself, e.g. by feeding back the output voltage of a power supply. The set point may, for example, be stored as a fixed set point quantity 104 within the controller, as indicated in FIG. 1. However, further examples may also include an optional input interface 106 for the set point so that a set point can be controlled or given by a further external entity or device. A first integrator 108 within the controller 100 serves to derive an accumulated error signal using an integrator input signal 110 depending on the feedback signal. In the particular example of FIG. 1, an error signal is generated by means of an adder 112, subtracting the set point 104 from a first scaled feedback signal generated by a first scaler 114 operable to scale the feedback signal by a first scaling parameter ($a_1$) so as to derive a signal depending on the error between the process variable 202 and the set point 104 for the same.

According to further examples, however, an error signal may be generated otherwise, for example outside of the controller 100 so that an error signal might also be directly provided to the input interface for receiving the feedback signal 102. Arbitrary further ways to generate an error signal may also be used to achieve the same or similar results. The controller 100 further comprises at least one resonator 120 having a predetermined resonance frequency, the at least one resonator 120 being adapted to provide a resonator output signal using a resonator input signal depending on the feedback signal.

In the example of FIG. 1, the resonator 120 comprises a second integrator 122 having an output coupled to an input of a third integrator 124 and a feedback loop coupled between an output of the third integrator 124 and an input of the second integrator 122, the feedback loop comprising at least a first feedback scaler 125 adapted to scale the signal of the output of the third integrator (124) by a first feedback parameter ($g_1$). The first feedback parameter may be used to alter the predetermined reference frequency of the resonator 120. A second scaler 126 is adapted to scale the feedback signal by a second predetermined scaling parameter ($a_2$) to provide a second scaled feedback signal as a contribution to a second integrator input signal of the second integrator 122 by means of a second adder 128. The resonator 120 further comprises a third scaler 127 adapted to scale the feedback signal by a third predetermined scaling parameter ($a_3$) to provide a third scaled feedback signal as a contribution to a third integrator input signal of the third integrator 124 by means of a third adder 129.

The controller 100 further comprises an output interface 130 which is adapted to provide a manipulation signal for influencing the generation of the process variable 202, the manipulation signal being derived using the accumulated error signal and the resonator output signal.

With respect to the further components of the controller 100, it is to be noted that those may be implemented in any arbitrary technique, be it in the analog or the digital domain. For example, integrators 108, 122 and 124 may be implemented using switched-capacitor integrators and amplifiers when implementing in the analog domain while the resonator may be implemented using conventional RLC-circuitry or the like in that event. When implemented in the digital domain, integration and resonating properties can be achieved by numerical calculations or the like.

Similarly, the manipulation signal may directly be used to influence or guide the controlled device or it may be transferred into a different domain, i.e. from analog to digital or vice-versa beforehand.

By incorporating a resonator 120 within a feedback loop within the controller 100, noise generation at a frequency equal or close to the predetermined resonance frequency of the resonator 120 may be suppressed efficiently from entering into the controlled process variable 202. In the event of the occurrence of noise at or close to the resonance frequency, the resonator will generate a strong response, leading to a high contribution of the resonator output signal to the manipulation signal and, hence, to a rather strong variation of the manipulation signal 118. A strong response in that sense may be understood to be a resonator output signal having an amplitude which is greater than an amplitude of an exciting signal. In the event of the occurrence of frequency components within the process variable which are close to the resonance frequency, those frequency components may hence be suppressed efficiently by means of the controller 100 itself. Additional conventional circuitry in the signal path of the process variable 202 may become abandoned. Hence, noise suppression may not only become more efficient but also cheaper and requiring less space and components as compared to conventional approaches, which will, for example, be discussed below with respect to FIGS. 3, 5 and 6.

In order to achieve efficient noise suppression at the predetermined resonance frequency, an additional phase shifter may be used optionally to apply a phase shift to the resonator feedback signal 114 such that a total phase shift within the feedback loop of the resonator amounts to 180°. In that event, the occurrence of noise at this particular frequency is suppressed to a very large extent. Referring to a phase shift of 180° does also include small deviations which may be unavoidable due to varying characteristics of the circuit components, such as for example temperature-dependent variances or variances occurring during the production processes, which is common in semiconductor production. To this end, a phase shift of 180° may, for example, also include phase shifts of roughly 180°, for example in between the range of 170° to 190°, of 160° to 200° or the like.

In the example of FIG. 1, a phase shift of 1880° is inherently achieved by means of the resonator implementation comprising the second integrator 122, the third integrator 124, the adder 128 and the adder 129. This particular implementation automatically provides for a phase shift of 180° for the signal fed back via the first feedback scaler 125 since each individual integrator provides for a phase shift of 90° summing up to the desirable total phase shift of 180°.

The controller 100 further shows an optional set point input interface 106 adapted to receive an externally provided set point signal 132 which could be both in the analog or digital domain. The set point signal 132 is indicative of the desirable set point for the process variable 202 and often a smooth signal varying slowly. In other words, the set point signal 132 indicates to what quantity or to what property the process variables 202 should be controlled, i.e. the desired value of the process variable 202.

Figure 2:
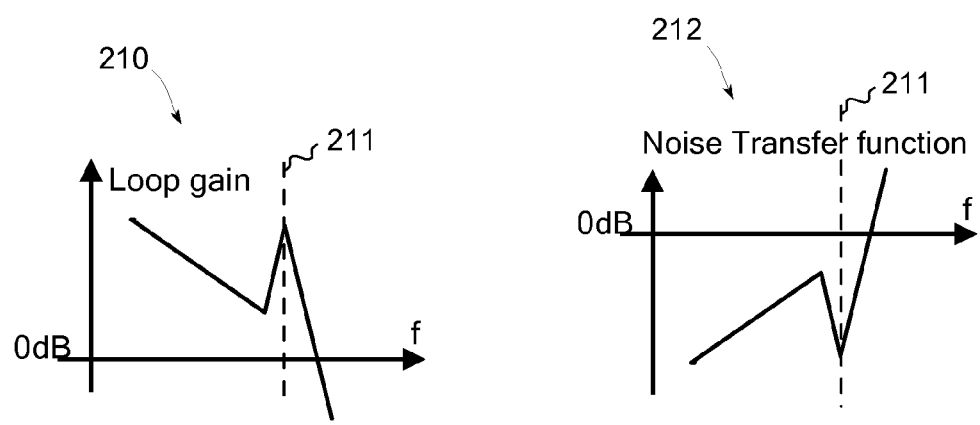
FIG. 2 shows an illustration of noise characteristics of the controller of FIG. 1.

FIG. 2 illustrates gain characteristics of the control loop of controller 100 as well as corresponding noise characteristics. In a first graph 210 illustrated in FIG. 2, a frequency dependency of a loop gain of the control-loop is given in qualitative terms and, hence, in arbitrary numbers. The loop gain rolls off from DC frequency with a slope of −20 dB/dec until it hits the resonance frequency 211 of the resonator 120 where the loop gain does in principle peak again to infinite gain due to the presence of the resonator 120 in the feedback loop of the controller 100 which is tuned to this frequency. After the resonance frequency 211, the gain decreases with a slope of −60 dB/dec of a third order filter. The noise transfer function illustrating the noise behavior is sown as a further graph 212 in FIG. 2. The noise transfer function is the inverse of the loop gain and, therefore, has infinite gain at both DC and at resonance frequency 211 in an idealized view.

In general terms, examples of controllers may determine a first portion of a generated manipulation signal using an accumulated error signal and a second portion of the generated manipulation signal using an output signal of a resonator. This may allow for both, considering an accumulation of an error signal to achieve stability and strong responses to efficiently suppress noise contributions with particularly strong variations of the manipulation signal, which may occur and also disappear on rather short timescales.

Figure 3:
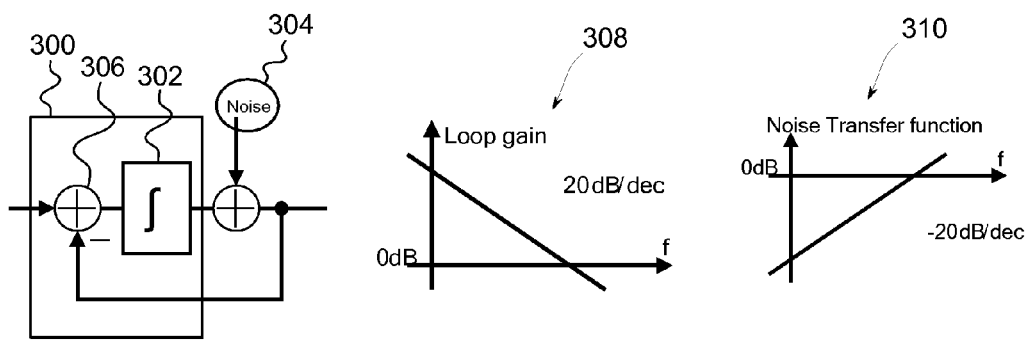
FIG. 3 shows a conventional controller and its associated noise characteristic.
Figure 5:
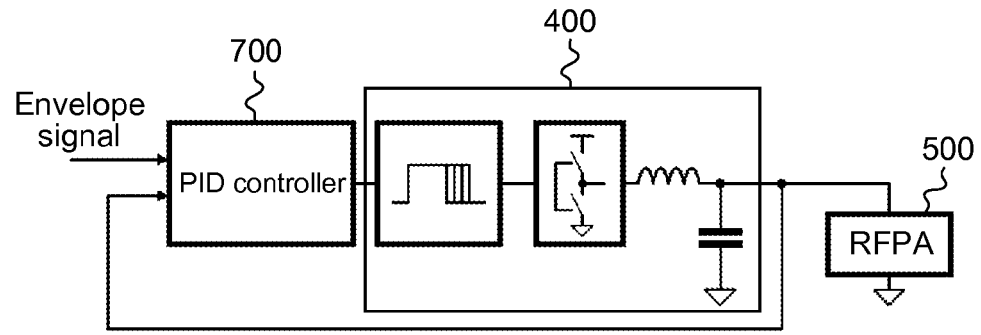
FIG. 5 shows an example of a conventional power supply.
Figure 6:
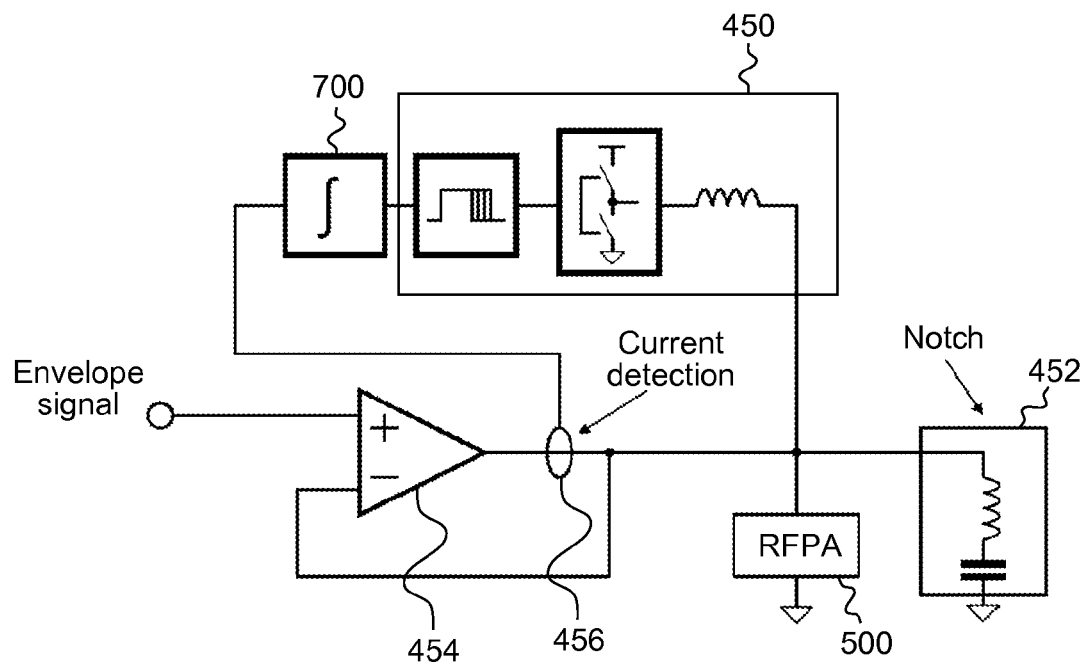
FIG. 6 shows a further conventional power supply.

For comparative purposes, FIG. 3 illustrates the loop gain and the noise transfer function of a conventional controller 300 having one integrator 302 in the control-loop, which is, for example, used within the conventional power supplies illustrated in FIGS. 5 and 6. The noise generation is again illustrated by means of a virtual noise source 304. The conventional controller 300 comprises a single integrator 302 and an adder 306 to consider the feedback signal within the control-loop, as illustrated in FIG. 3. The frequency response of the loop gain is, similar to FIG. 2, illustrated to the right of FIG. 3 as a first graph 308 having a slope of 20 dB/dec corresponding to a filter having a single pole. Noise, as incorporated for example by a power supply due to quantization noise of a digital pulse width modulator or by means of modulation of the signal generated by the device controlled by the controller 300 is also attenuated by the loop structure of the conventional control-loop 300. The amount of attenuation at a given frequency, i.e. the noise transfer function, is illustrated in graph 310, which also has a slope of 20 dB/dec. At a frequency around a bandwidth of the loop, the attenuation of noise is already roughly 0 dB. As a general rule, one may assume that the noise at a certain frequency is proportional to the bandwidth of the loop. If, however, such a controller is used to control a DC-DC converter of e.g. a mobile device, the bandwidth is limited to the switching frequency of a pulse width modulator (PWM) and hence, such a structure is unable to achieve a low noise for a frequency or band of above approximately 30 MHz.

For example in an application with a power supply, examples of controllers 100 may unfold their benefits in that noise components within the controlled process variable, i.e. within a supply voltage of the power supply being provided to an amplifier may be suppressed also at high frequencies, which is given primarily by the resonance frequency of the resonator.

Figure 4:
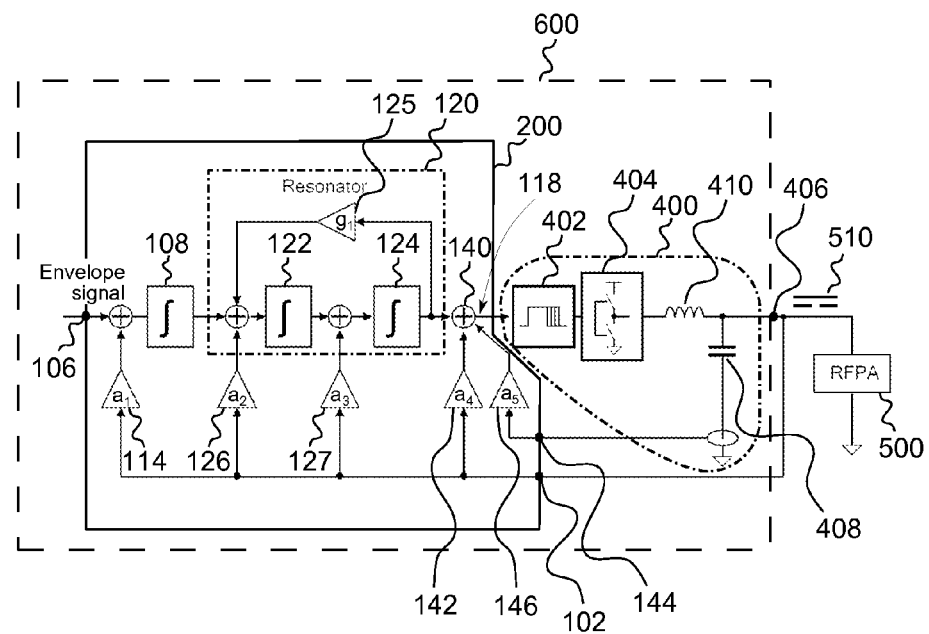
FIG. 4 shows an example of a power supply circuit comprising a power supply controlled by a controller.

The application of an example of a controller 100 to control the generation of a supply voltage of a power supply is illustrated in more detail in FIG. 4. FIG. 4 shows an example of a controller 200 together within a principal sketch of a power supply circuit 600 comprising a power supply 400 used to provide a dc supply voltage 510 for a radio frequency amplifier 500 (RFPA). The power supply circuit 600 comprises an example of a controller 200 and an adjustable power supply 400.

Most of the components of the controller 200 have already been discussed in connection with FIG. 1 so that a repeated description of the basic components of the controller is omitted. Instead, reference is made to FIG. 1 with respect to an explanation of the functionality of those components. The adjustable power supply 400 of FIG. 4 is a switching power supply or a DC-DC converter comprising a pulse width modulator 402 (PWM) and a driver circuit 404. The driver circuit 404 is adapted to provide a system supply voltage to an output interface 406 of the power supply 400 during time instants depending on a duty cycle of a pulse width modulation signal provided by the pulse width modulator 402. That is, for example, at times when the pulse width modulated signal is "high", the system supply voltage may be switched to the output interface 406, while the driver circuit 404 is not supplying a voltage within the remainder of a duty cycle. In the particular example of FIG. 4, the power supply 400 further comprises a low-pass filter at its output in order to suppress the switching ripple contained in the PWM at the output of the power supply. To this end, at least one capacitor 408 is coupled between the output interface 406 and a reference potential, e.g. ground. An additional inductance 410 of an LC filter serves for the same purpose.

In addition to the three adders of the controller illustrated in FIG. 2, the controller 200 of FIG. 4 further comprises a fourth adder 140 within the control-loop for adding a scaled representation of the feedback signal to the manipulation signal 118 via a fourth scaler 142 ($a_4$). This may be understood as the addition of a proportional component to the control-loop so that the integrator 108 provides a control feedback based on an integrative component (I) of the error signal, the resonator 120 providing a resonant component and the adder 140 serves to add a proportional component (P) to the feedback, i.e. to the derivation of the manipulation signal 118. The controller 200 comprises a further input interface 144 adapted to receive a further feedback signal. As illustrated in FIG. 4, the further feedback signal of the power supply circuit 600 is derived from the current over the capacitor 408 and is therefore also indicative of an error between the process variable, i.e. between the supply voltage 510 and the setpoint for said voltage. The further feedback signal is scaled by means of a fifth scaler 146 ($a_5$) and added by means of the adder 140. To this end, the derivation of the further feedback signal from the current over the capacitor 408 may provide a derivative component (D) to the derivation of the manipulation signal. The control circuit 200 may hence also be seen as a PID-controller considering proportional (P), integral (I) and derivative (D) components of the process variable as well as a resonant component in order to derive an appropriate manipulation signal 118. In order to be able to adjust the output voltage 510 of the power supply 400 by means of the manipulation signal 118, the manipulation signal generated by the controller 200 is provided to a control input interface of the power supply 400.

Generating the further feedback signal from the current over the capacitor 408 may have the benefit that this directly provides a feedback which depends on a derivative of the process variable, i.e. of the output voltage 510 of the power supply 400. This may be particularly beneficial since a derivative component is sensitive to noise and hence its use in conventional PID-controllers might lead to instabilities. However, receiving the further feedback signal as indicated in FIG. 4 avoids the necessity to generate a derivative of the feedback signal within the controller itself and uses a signal which is inherently indicative of the derivative of the output voltage 510 instead. Hence, this signal component may be used without running into the danger of instabilities within the control-loop.

The use of a power supply circuit as illustrated in FIG. 4 and using a controller 200 according to an example may avoid the incorporation of noise components into the output of the radio frequency amplifier 500 with high efficiency and without the requirement for additional circuitry. For comparative reasons, conventional power supply circuits are illustrated in FIGS. 5 and 6. DC-DC converters or power supplies as illustrated in FIG. 5 are conventionally used as a power supply for an envelope tracking radio frequency amplifier 500. The envelope signal, i.e. the set point for the controller is input into the PID-controller 700 incorporating a conventional feedback loop as illustrated in FIG. 3. The supply voltage output from the power supply 400 is copied to the PID-controller 700 as a feedback signal according to the conventional approaches. While the overall structure may provide for good efficiency, it is not capable of attenuating noise at a frequency range near and above bandwidth, as already explained with respect to FIG. 3 illustrating the closed-loop control of the PID-controller 700.

As elaborated on before, the incorporation of examples of controllers 200 or use of power supply circuits 600 according to some examples may provide for a noise suppression capability without the necessity of using further circuitry as in the further conventional approach according to FIG. 6. FIG. 6 illustrates a power supply circuit where the noise that may be introduced by means of the power supply 450 is eliminated using additional circuitry, i.e. a notch or snubber filter circuit 452, effectively short circuiting the noise of the predetermined frequency. In the power supply circuit of FIG. 6, which may also be used for envelope tracking radio frequency power amplifiers 500, it is further proposed to achieve a high bandwidth by the additional incorporation of a linear operational amplifier 454 to extend the capabilities of the DC-DC converter or power supply 450. A current 456 flowing out of and into the operational amplifier 454 is measured and fed to the control-loop of the DC-DC converter or power supply 450, i.e. to the controller 700 of the same. The controller 700 is used to ensure that the operational amplifier 454 delivers zero current to the load at static conditions, where the load current is supplied by the DC-DC converter 450. The overall efficiency, dominated by the DC-DC converter 450 taking the majority of the load current may be high while the bandwidth, mainly determined by the linear operational amplifier, may be enhanced as compared to the single use of a DC-DC converter into the several tenths of Megahertz. However, in order to achieve low noise at a certain pre-defined band, an additional LC snubber or notch circuit 452 is required to provide low impedance and eliminate the signal at that band. The inductor and capacitor of the snubber circuit 452, however, need to be realized with external SMD-components, which consume additional space, which might be unacceptable in mobile devices having limited size and space. Moreover, they increase system complexity, cost and reliability by the incorporation of an additional possible point of failure. A further problem of this approach is that the amplifier employed in this structure limits the overall efficiency further. The output stage of the operational amplifier 454 needs to withstand the voltage swing, making the design of the same difficult, in particular with respect to the required reliability.

By using a power supply circuit as, for example, shown in FIG. 4, noise may be suppressed at or in the vicinity of a predetermined resonance frequency with high efficiency and without the need to incorporate any additional devices or complicated circuitry, although still providing high suppression of noise.

In summary, the previously-discussed examples use loop-filters, sometimes of high order, to achieve high suppression of distortion and noise within a process variable or at an output of a DC-DC converter. A resonator is used to cancel noise and distortion at a predetermined resonance frequency which may be also outside of a transmission bandwidth of the DC-DC converter. According to some examples, an LC-filter at an output of the DC-DC converter is also incorporated into the control-loop, enabling the obtaining of a high bandwidth and flexibility for noise shaping, for example by also considering a derivative component within the control-loop. That is, those examples may also allow predicting a change of the process variable to a certain extent without running into danger of becoming unstable.

Figure 7:
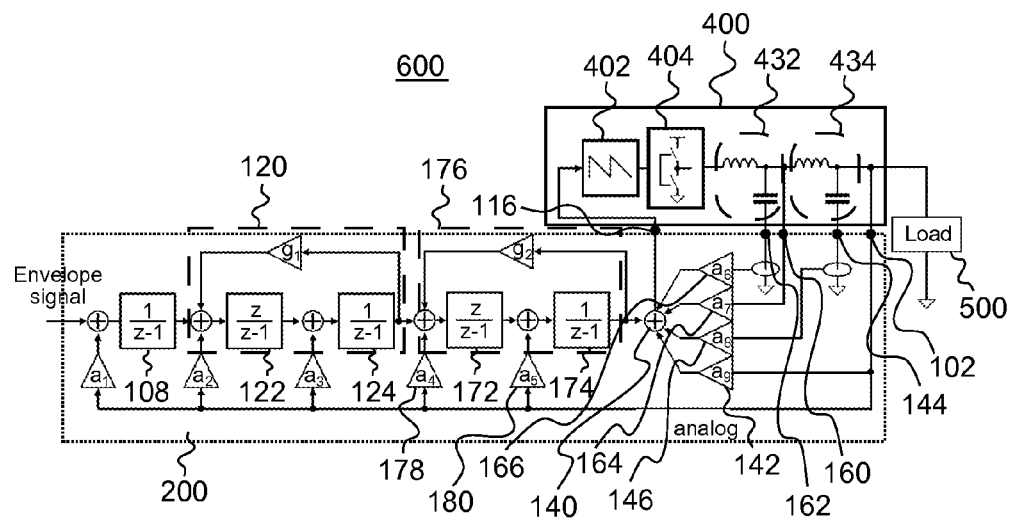
FIG. 7 shows a further example of a power supply circuit.
Figure 8:
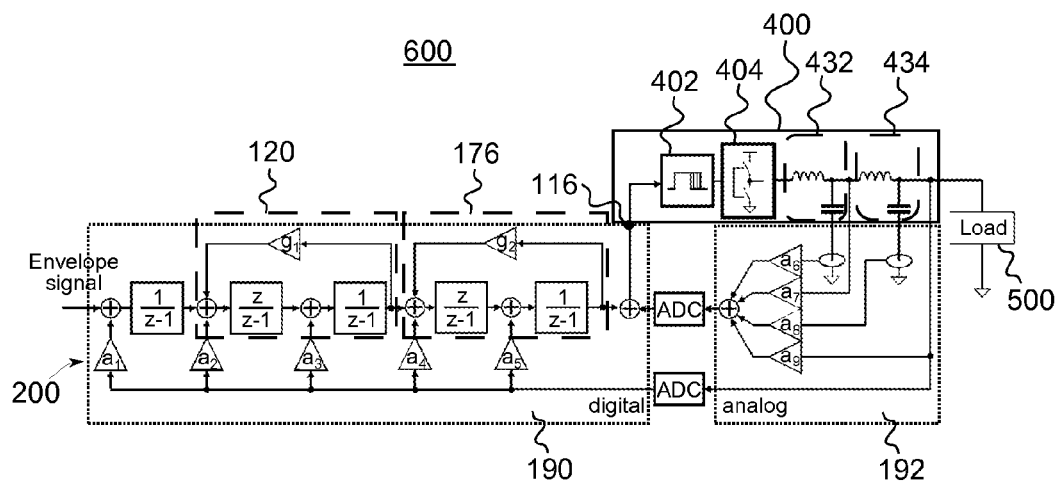
FIG. 8 shows a further example of a power supply circuit.
Figure 9:
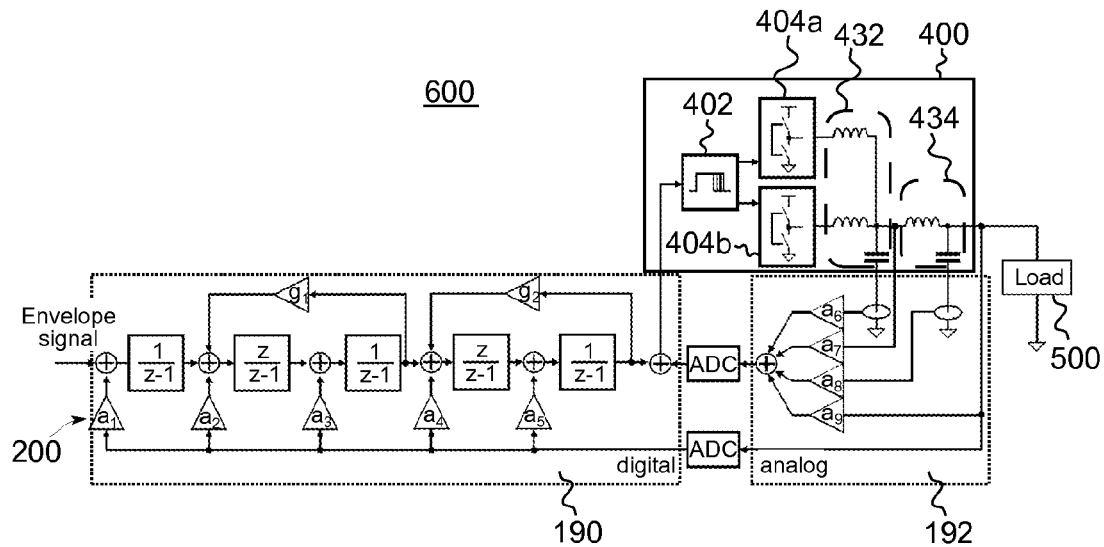
FIG. 9 shows a further example of a power supply circuit.

FIGS. 7 to 9 show further examples of power supply circuits 600 comprising controllers 200 and power supplies 400. Since those examples are based on the general considerations as already set forth with respect to FIGS. 1 and 4 only the new components of the examples of FIGS. 7 to 9 will be discussed shortly within the following paragraphs.

The power supplies 400 of the examples of FIGS. 7 to 9 comprise two LC-filters 432 and 434 in order to filter the signal provided by the driver circuit 404 to a higher extent and to potentially comply even better with the spectral requirements that may be set up for a radio frequency amplifier 500 fed by the power supply 400.

This enables to feed two further feedback signals to the controller 200, i.e. the controller 200 has a third input interface 160 adapted to receive the voltage after the first LC-filter 432 as a third feedback signal and a fourth input interface 162 adapted to receive a signal depending on a current flowing over the capacitor of the first LC-filter 432 as a fourth feedback signal indicative of an error between the process variable and the set point.

Similar to the example of FIG. 4, the feedback signals are scaled by associated scalers 142 ($a_9$), 146 ($a_8$), 164 ($a_7$) and 166 ($a_6$) and the scaled representations of those are finally summed up by the adder 140.

The order of the control-loop is increased by adding two additional integrators 172 and 174 into the control-loop within a second resonator 176 having a predetermined second resonance frequency. That is, a second resonator 176 is present within the control loop of controller 200 of FIGS. 7 ad 8. Similar to the scaling of the feedback signal for the integrators 122 and 124 of the first resonator, further scalers 178 ($a_4$) and 180 ($a_5$) are incorporated in order to provide scaled feedback signals as received from the input interface 102 to an integrator input of the integrators 172 and 174. The incorporation of a second resonator circuit 176 within the control-loop may provide for the possibility to make the frequency range or bandwidth wider, within which noise is suppressed efficiently by examples of controllers. If, for example, the resonance frequencies of the resonators 120 and 176 are close to one another, the bandwidth in which the suppression of the noise signal is effective may be approximately doubled. In principle, the number of resonators in the control loop can be adjusted to the particular requirements and even become arbitrarily high.

Although the integrators 124, 174 and 108 incorporate an additional delay of one sample according the time-discrete representation of the integrators in FIG. 7, further examples may be implemented without additional delays or by incorporating delays of a higher number of samples.

The main difference between the examples of FIG. 7 and of FIG. 8 is that the example of FIG. 7 is implemented within the analog domain. That is, the controller 200 and the state variable feedback of the parameters of the LC-LC filter, i.e. of the LC-filters 432 and 434, are implemented with analog circuitry, for example using switched-capacitor integrators and amplifiers. The output signal, i.e. the manipulation signal as provided at the output interface 116 is serving as an input to a PWM-generator 402. The manipulation signal received by the control input interface of the adjustable power supply 400 is compared with an internal ramp signal so as to generate a pulse width modulated signal having a duty cycle proportional to the input signal.

On the contrary, the example of FIG. 8 is, at least partly, implemented within the digital domain. In particular, a fifth-order controller portion 190 is implemented with digital circuitry. Hence, also the manipulation signal provided at the output interface 116 is understood to be a digital signal which is fed to a digitally-controllable pulse width modulation circuit 402 (DPWM) which controls a driver circuit 404. The analog portion 192 of the controller 200 is implemented with analog circuitry in order to feed back the state variables of the LC-LC-filters 432 and 434. In order to transfer the feedback signals from the analog portion 192 into the digital portion 190 of the controller 200, analog-to-digital converters (ADC) 494 and 496 are implemented.

Using an example according to FIG. 8 may increase the implementation flexibility, since the digital domain circuitry, i.e. the digital portion of the controller 190 may be adapted to specific requirements without a time-consuming and costly redesign, for example by simply updating an operating software or a firmware of a corresponding controller.

FIG. 9 illustrates an example of a power supply circuit which is based on the example of FIG. 8, wherein the digital pulse width modulator 402 provides two pulse width modulated signals phase-inverted with respect to each other. Those two signals drive two driver circuits 404a and 404b simultaneously, effectively doubling the switching frequency.

Summarizing some of the previously-discussed examples, power supply circuits comprising DC-DC functionality may incorporate, in addition to an integrator, a resonator within the control-loop of the controller 200. The resonator provides for a high loop gain at the predetermined resonance frequency and in its vicinity, enabling the control-loop to effectively attenuate noise at that frequency. The predetermined resonance frequency may be programmable or fixed, depending on the specific implementation. The control-loop itself may include multiple feedbacks in order to adjust the coefficients of the feedback-scalers, i.e. of the scalers used to provide scaled representations of the feedback signal according to the needs and to provide for the required stability of the loop. Furthermore, the output of a filter of a DC-DC converter or power supply itself may be treated as a part of the control-loop. For example, the voltage and the current of the capacitor of the LC-filter at the output of a driver circuit 404 may provide feedback signals that are fed back via associated scalers into the control-loop. The poles of a mathematical description of the response of the control-loop and hence the stability of the closed-loop system is determined by the coefficients within the feedback loop, i.e. for example, depending on coefficients $a_1$ to $a_9$ of the examples of FIGS. 7 to 9.

Figure 10:
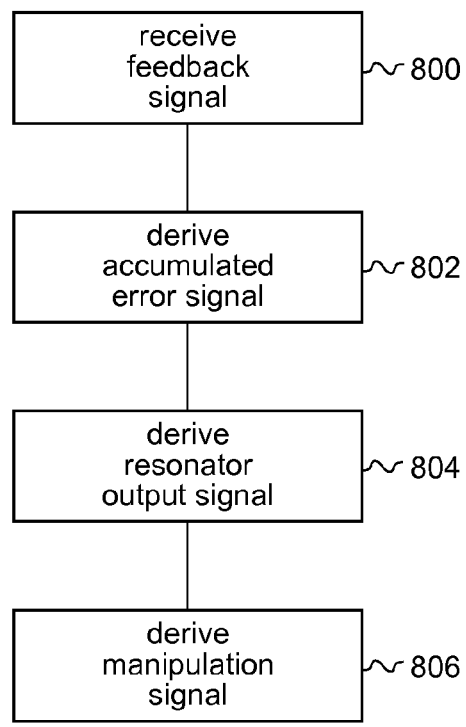
FIG. 10 shows a schematic illustration of an example of a method for controlling a process variable.
Figure 11:
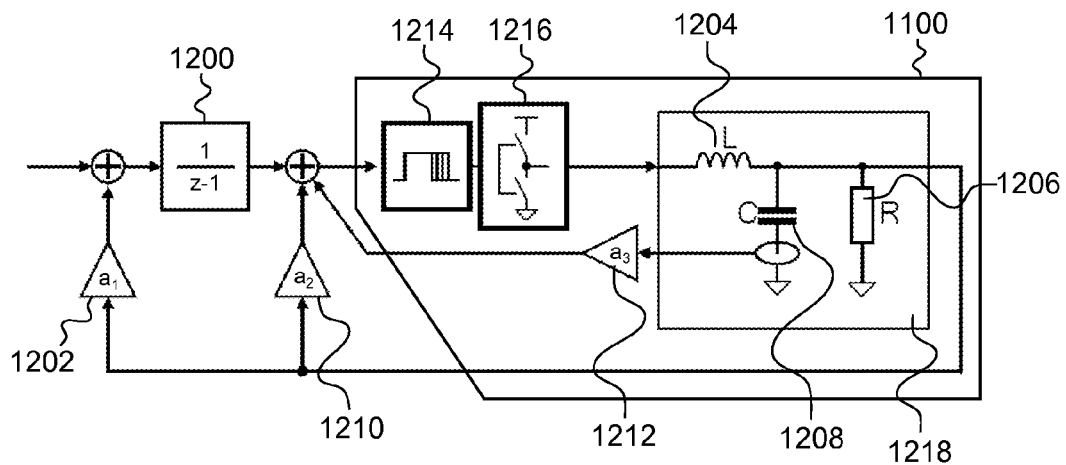
FIG. 11 shows a schematic illustration of an example of a controller and a power supply for providing a model for a mathematical description of the system.
Figure 11:
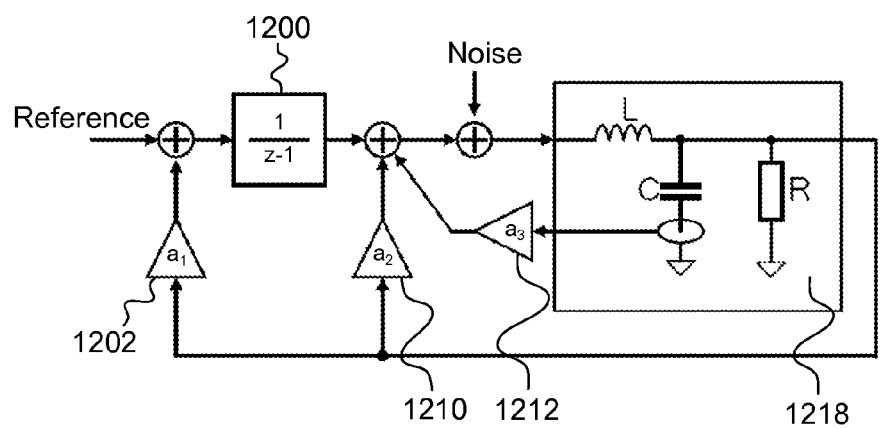

FIG. 10 illustrates a block diagram illustrating an example of a method for controlling a process variable.

The method comprises receiving 800 a feedback signal indicative of an error between a process variable to be controlled and a setpoint for the process variable.

The method further comprises deriving an accumulated error signal 802 using an input signal depending on the feedback signal and deriving a resonator output signal 804 using a resonator having a predetermined resonance frequency and a resonator input signal depending on the feedback signal.

The method further comprises deriving a manipulation signal 806 for influencing the process variable, the manipulation signal being derived using the accumulated error signal and the resonator output signal.

Together with the illustrations of FIGS. 11 to 15 it will in the following be shown, as to how the coefficients within a power supply circuit according to FIGS. 7 to 9 may be determined in order to achieve a desirable stable control, at the same time attenuating noise by means of the resonators within the controller.

To this end, some theoretical considerations as to how continuous time circuitry may be transferred into a discrete time representation are performed beforehand. The consideration starts with a simple implementation of a DC-DC-converter with state variable feedback. The exemplary loop of FIG. 11 consists of an integrator 1200 eliminating static regulation errors. The error signal, i.e. the deviation of the output voltage of the DC-DC-converter from the reference voltage at the input is scaled by the scaler 1202 (coefficient $a_1$) and accumulated by the integrator 1200. The state variables of the second order system consisting of the inductance 1204 (L), the resistance 1206 (R) and the capacitance 1208 (C), i.e. the voltage $V_c$ and the current $I_c$ of the capacitor 1208, are scaled by coefficients $a_2$ and $a_3$ by means of scalers 1210 and 1212 and added to the integrator output. For a linear analysis of the control-loop, the pulse width modulator 1214 and the driver of the DC-DC-converter is ignored and those components are seen as a source of additional noise as illustrated in the simplified circuit diagram in the bottom illustration of FIG. 11. The pulse width modulator and the driver circuit are modeled as a linear scaler superimposed by a noise generator.

Figure 12:
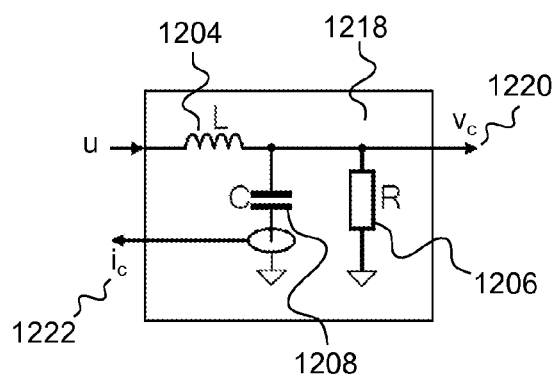
FIG. 12 shows a filter circuit of the power supply of FIG. 11 in detail.

Before being able to calculate coefficients $a_1$ to $a_3$, the second order filter 1218 (LCR filter), as again illustrated in FIG. 12, should be converted from a time-continuous system to a discrete time one, especially to provide a time discrete representation of the feedback quantities 1220 ($v_c$) and 1222 ($i_c$).

This may be performed using the following equations:

$$\dot{x} = Ax + Bu$$

$$y = Cx + Du$$

$$x = \begin{bmatrix} x_1 \\ x_2 \end{bmatrix} = \begin{bmatrix} v_C \\ i_C \end{bmatrix},$$

$$A = \begin{bmatrix} -1/RC & 1/C \\ -1/L & 0 \end{bmatrix},$$

$$B = \begin{bmatrix} 0 \\ 1/L \end{bmatrix},$$

$$C = [1 \quad 0],$$

$$D = [0].$$

Assuming that the discrete-time system is described by the following form:

$$x(n+1) = \tilde{A}x(n) + \tilde{B}u(n)$$

$$y(n) = \tilde{C}x(n) + \tilde{D}u(n),$$

the converted system can be derived with the following form:

$$\tilde{A} = e^{AT}, \tilde{B} = \int_0^T e^{A\eta} d\eta B, \tilde{C} = C, \tilde{D} = D.$$

Since a conversion from a continuous-time to discrete-time system with symbolic expression is impossible, the conversion is done numerically. Assume L=11 n, C=2 nF, R=10 Ohm, T=1/300 MHz=3.33 ns, and no delay at input leads to:

$$\tilde{A} = \begin{bmatrix} 0.7707 & 1.4092 \\ -0.2562 & 0.6298 \end{bmatrix}$$

$$= \begin{bmatrix} a_{11} & a_{12} \\ a_{21} & a_{22} \end{bmatrix},$$

$$\tilde{B} = \begin{bmatrix} 0.2293 \\ 0.2562 \end{bmatrix}$$

$$= \begin{bmatrix} b_1 \\ b_2 \end{bmatrix}.$$

Figure 13:
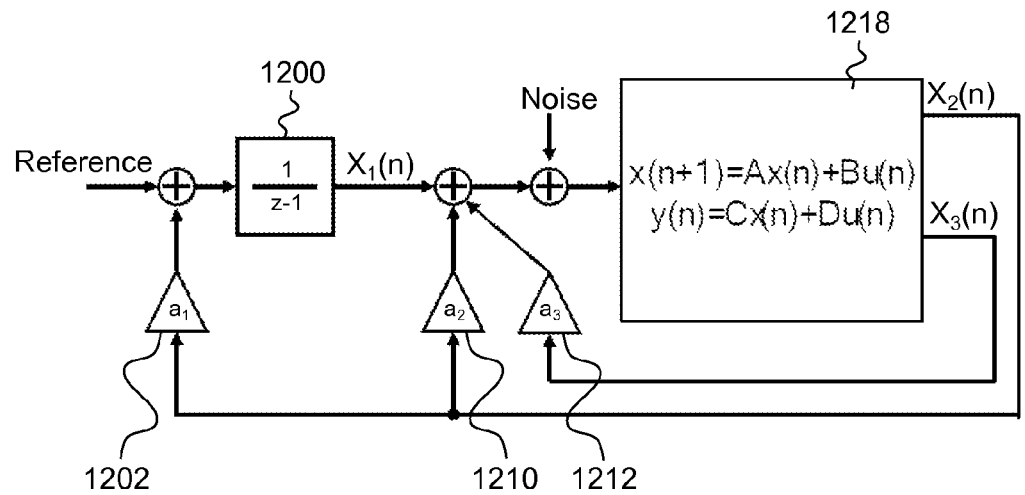
FIG. 13 illustrates the configuration of FIG. 11 in a time-discrete domain.

After the discretization of the LCR filter, one can continue with the derivation of the coefficients of the control loop. With the additional order coming from the integrator, one is dealing with a system of third-order illustrated in FIG. 13. In FIG. 13 the voltage of capacitor 1208 is redefined as $x_2$, the current of the capacitor 1208 as $x_3$, and the output of the integrator 1200 as $x_1$.

Figure 14:
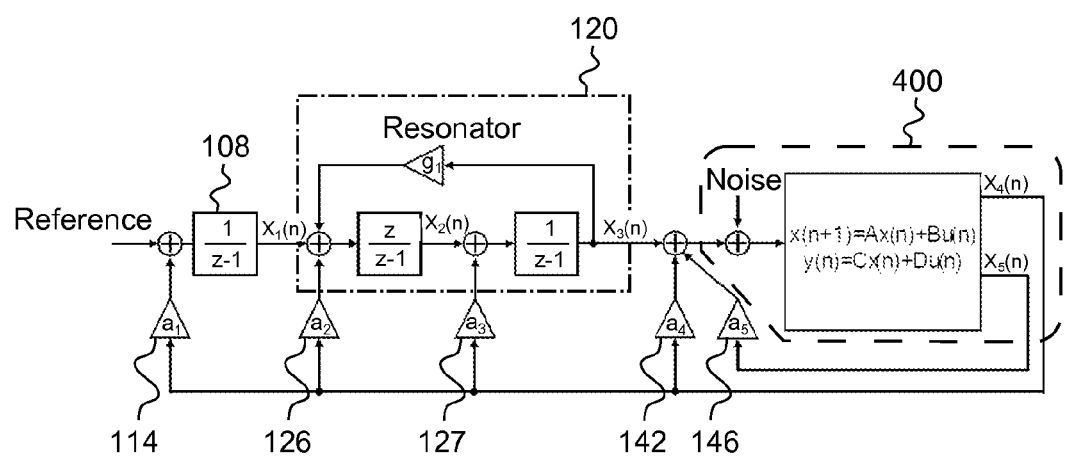
FIG. 14 shows an example of a power supply circuit in a time-discrete domain.

In FIG. 14 the System, the system of FIG. 13 is further modified to correspond to the example of FIG. 4. To this end, a resonator and the additional integrators are added to the control loop in order to result with a DC-DC converter that may cancel also high frequency noise. From the representation of FIG. 14 one can derive the following state space description of the control loop including the LC-LC filter in discrete-time form:

$$A = \begin{bmatrix} 1 & 0 & 0 & 0 & a_1 \\ 1 & 1 & g_1 & 0 & a_2 \\ 1 & 1 & 1+g_1 & 0 & a_3+a_2 \\ 0 & 0 & b_1 & a_{11}+b_1 a_4 & a_{12}+b_2 a_5 \\ 0 & 0 & b_2 & a_{21}+b_2 a_4 & a_{22}+b_2 a_5 \end{bmatrix},$$

$$B = \begin{bmatrix} 1 \\ 0 \\ 0 \\ 0 \\ 0 \end{bmatrix},$$

$$C = [0 \quad 0 \quad 0 \quad 0 \quad 1],$$

$$D = 0$$

The signal transfer function $F_{STF}$ may be calculated as:

$$F_{STF} = C(Iz-A)^{-1}B.$$

Comparing the denominator of the signal transfer function $F_{STF}$ with the target denominator $z^5 + p_4 z^4 + p_3 z^3 + p_2 z^2 + p_1 z + p_o$, one may then be able to calculate the coefficients $a_5 \ldots a_1$ numerically. The calculation may, for example, be performed using the following pseudo-code:

```
% define the output filter of the dcdc and switching frequency
    l1=10e-9; c1=1e-9; r=10;
    fs=300e6;
% define the desired poles and notch frequency
    pl1 = 0.2;
    pl2 = 0.2;
    pl3 = 0.2;
    pl4 = 0.2;
    pl5 = 0.2;
    g1=-1;
% convert the poles to denominator
    p = poly([pl1,pl2,pl3,pl4,pl5]);
% continuous-time state-space description of output filter
    A_lc2_ct = [-1/r/c1,-1/l1;1/c1,0];
    B_lc2_ct = [1/l1;0];
    C_lc2_ct = [0,1];
    D_lc2_ct = 0;
% convert continuous-time model to discrete-time model
    sys_lc2_ct = ss(A_lc2_ct,B_lc2_ct,C_lc2_ct,D_lc2_ct);
    sys_lc2_dt = c2d(sys_lc2_ct,1/fs,'zoh');
    [A_lc2_dt,B_lc2_dt,C_lc2_dt,D_lc2_dt]=ssdata(sys_lc2_dt);
% assign the state-space parameter to variables
    a11=A_lc2_dt(1,1);a12=A_lc2_dt(1,2);
    a21=A_lc2_dt(2,1);a22=A_lc2_dt(2,2);
    b1 =B_lc2_dt(1); b2 =B_lc2_dt(2);
% define symbols and later on solve for the symbols
    syms a1 a2 a3 a4 a5 a6 a7 a8 a9 z real
% define state-space model of the entire controller
    A_stf=[...
        1,0,0,0,a1;...
        1,1,g1,0,a2;...
        1,1,1+g1,0,a3+a2;...
        0,0,b1,a11+b1*a4,a12+b1*a5;...
        0,0,b2,a21+b2*a4,a22+b2*a5];
    B_stf=[-a1;0;0;0;0];
    C_stf=[0,0,0,0,1];
    D_stf=[0];
% calculate the denominator of the transfer function
    den_stf=coeffs(det(z*eye(5)-A_stf),z);
% compare the desired denominator and the one of controller
% and calculate the coefficients
    [a1,a2,a3,a4,a5]=solve(den_stf(5)-p(2),den_stf(4)-p(3),...
        den_stf(3)-p(4),den_stf(2)-p(5),den_stf(1)-p(6));
    a1=double(a1);a2=double(a2);a3=double(a3);a4=double(a4);
    a5=double(a5);
```

Figure 15:
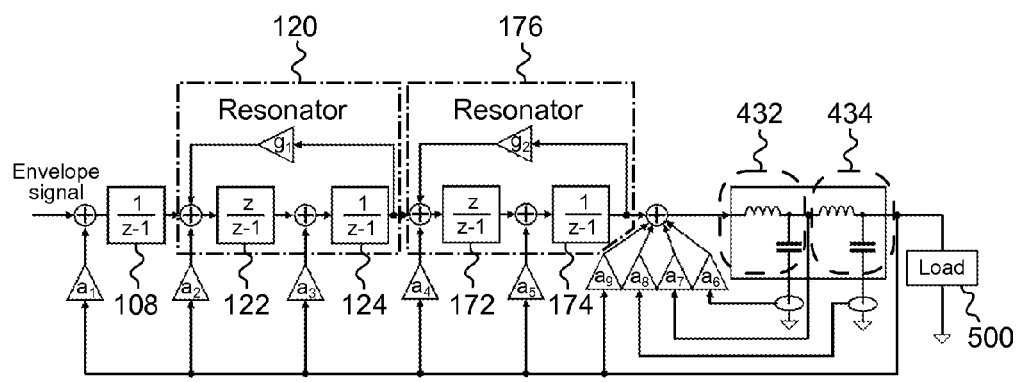
FIG. 15 shows a further example in the time-discrete domain.

FIG. 15 illustrates the model for the examples of FIGS. 7 and 8. Equivalently, the state-space description of the fifth-order controller with fourth-order LC-LC filter of FIGS. 7 and 8 is:

$$A = \begin{bmatrix} 1 & 0 & 0 & 0 & 0 & 0 & 0 & 0 & a_1 \\ 1 & 1 & g_1 & 0 & 0 & 0 & 0 & 0 & a_2 \\ 1 & 1 & 1+g_1 & 0 & 0 & 0 & 0 & 0 & a_3+a_2 \\ 0 & 0 & 1 & 1 & g_2 & 0 & 0 & 0 & a_4 \\ 0 & 0 & 1 & 1 & 1+g_2 & 0 & 0 & 0 & a_5+a_4 \\ 0 & 0 & 0 & 0 & b_1 & a_{11}+b_1a_6 & a_{12}+b_1a_7 & a_{13}+b_1a_8 & a_{14}+b_1a_9 \\ 0 & 0 & 0 & 0 & b_2 & a_{21}+b_2a_6 & a_{22}+b_2a_7 & a_{23}+b_2a_8 & a_{24}+b_2a_9 \\ 0 & 0 & 0 & 0 & b_3 & a_{31}+b_3a_6 & a_{32}+b_3a_7 & a_{33}+b_3a_8 & a_{34}+b_3a_9 \\ 0 & 0 & 0 & 0 & b_4 & a_{41}+b_4a_6 & a_{42}+b_4a_7 & a_{43}+b_4a_8 & a_{44}+b_4a_9 \end{bmatrix},$$

$$B = \begin{bmatrix} a_1 \\ 0 \\ 0 \\ 0 \\ 0 \\ 0 \\ 0 \\ 0 \\ 0 \end{bmatrix},$$

$$C = [0 \ 0 \ 0 \ 0 \ 0 \ 0 \ 0 \ 0 \ 1],$$

$$D = 0$$

Following the same considerations, a pseudo code that calculates the coefficients $a_1 \ldots a_9$ can be given below:

```
% Define the output filter of the dcdc and switching frequeny
    l1=10e-9;l2=5e-9;c1=1e-9;c2=1e-9;r=10;
    fs=300e6;
% Define the desired poles and notch frequency
    pl0 = 0.0j+0.1;
    pl1 = -0.0j+0.1;
    pl2 = 0.0j+0.2;
    pl3 = -0.0j+0.2;
    pl4 = 0.1;
    pl5 = 0.1;
    pl6 = 0.0;
    pl7 = 0.2;
    pl8 = 0.2;
    g1=-0.05;
    g2=-0.1;
% convert the poles to denominator
    p = poly([pl0,pl1,pl2,pl3,pl4,pl5,pl6,pl7,pl8]);
% continuous-time state-space description of output filter
    A_lc4_ct = [0,-(1/l1+1/l2),0,1/l2;1/c1,0,0,0;0,1/l2,-1/r/c2,-1/l2;
    0,0,1/c2,0];
    B_lc4_ct = [1/l1;0;0;0];
    C_lc4_ct = [0,0,0,1];
    D_lc4_ct = 0;
% convert continuous-time model to discrete-time model
    sys_lc4_ct = ss(A_lc4_ct,B_lc4_ct,C_lc4_ct,D_lc4_ct);
    sys_lc4_dt = c2d(sys_lc4_ct,1/fs,'zoh');
    [A_lc4_dt,B_lc4_dt,C_lc4_dt,D_lc4_dt]=ssdata(sys_lc4_dt);
% assign the state-space parameter to variables
    a11=A_lc4_dt(1,1);a12=A_lc4_dt(1,2);a13=A_lc4_dt(1,3);
    a14=A_lc4_dt(1,4);
    a21=A_lc4_dt(2,1);a22=A_lc4_dt(2,2);a23=A_lc4_dt(2,3);
    a24=A_lc4_dt(2,4);
    a31=A_lc4_dt(3,1);a32=A_lc4_dt(3,2);a33=A_lc4_dt(3,3);
    a34=A_lc4_dt(3,4);
    a41=A_lc4_dt(4,1);a42=A_lc4_dt(4,2);a43=A_lc4_dt(4,3);
    a44=A_lc4_dt(4,4);
    b1 =B_lc4_dt(1); b2 =B_lc4_dt(2); b3 =B_lc4_dt(3);
    b4 =B_lc4_dt(4);
% define symbols and later on solve for the symbols
    syms a1 a2 a3 a4 a5 a6 a7 a8 a9 z real
```

```
% define state-space model of the entire controller
    A_stf=[...
    1,0,0,0,0,0,0,0,a1;...
    1,1,g1,0,0,0,0,0,a2;...
    1,1,1+g1,0,0,0,0,0,a3+a2;...
    0,0,1,1,g2,0,0,0,a4;...
    0,0,1,1,1+g2,0,0,0,a5+a4;...
    0,0,0,0,b1,a11+b1*a6,a12+b1*a7,a13+b1*a8,a14+b1*a9;...
    0,0,0,0,b2,a21+b2*a6,a22+b2*a7,a23+b2*a8,a24+b2*a9;...
    0,0,0,0,b3,a31+b3*a6,a32+b3*a7,a33+b3*a8,a34+b3*a9;...
    0,0,0,0,b4,a41+b4*a6,a42+b4*a7,a43+b4*a8,a44+b4*a9];
    B_stf=[-a1;0;0;0;0;0;0;0;0];
    C_stf=[0,0,0,0,0,0,0,0,1];
    D_stf=[0];
% calculate the denominator of the transfer function
    den_stf=coeffs(det(z*eye(9)-A_stf),z);
% compare the desired denominator and the one of controller
% and calculate the coefficients
    [a1,a2,a3,a4,a5,a6,a7,a8,a9]=solve(den_stf(9)-p(2),
    den_stf(8)-p(3),...
    den_stf(7)-p(4),den_stf(6)-p(5),den_stf(5)-p(6),
    den_stf(4)-p(7),...
    den_stf(3)-p(8),den_stf(2)-p(9),den_stf(1)-p(10));
    a1=double(a1);a2=double(a2);a3=double(a3);a4=double(a4);
    a5=double(a5);a6=double(a6);a7=double(a7);a8=double(a8);
    a9=double(a9);
    coeff_a=[a1;a2;a3;a4;a5;a6;a7;a8;a9];
```

Figure 16:
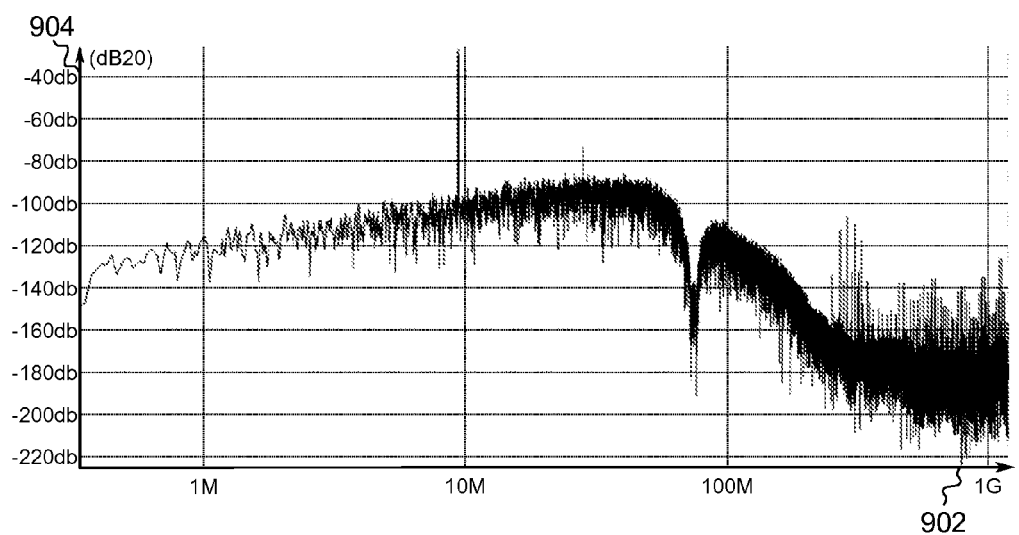
FIG. 16 shows a simulation result of the noise characteristics of an example of a power supply circuit.

FIG. 16 illustrates the noise characteristics of a simulation of an example of a power supply circuit as illustrated in FIG. 9 using the previously derived coefficients and parameters. The x-axis 902 illustrates the frequency in units of Hertz on a logarithmic scale. The y-axis 904 gives the noise level in dB. Recalling shortly, the fifth-order controller of FIG. 9 contains two resonators and the LC-LC filter provides four feedback coefficients. The digital pulse width modulator (DPWM) has a resolution of 5 bit and two phase-inverted outputs are in order to model multi-phase DC-DC converter. The currents of the two capacitors are detected with dc voltage sources and a current-controlled-voltage-source. The controller is simulated to run at a sampling frequency of 300 MHz and the dual-phase DPWM runs at 150 MHz to cancel the 150 MHz spurious in the output spectrum. The DC-DC converter is simulated with Spectre and a sinusoidal signal of is used as input stimulus. The power supply circuit is stable and follows the input signal. The granuality of the DPWM generates a quantization noise, which is shaped by the control loop within the example of a controller. FIG. 16 illustrates the noise spectrum of the power supply circuit and demonstrates that the noise is notched at 75 MHz as desired and its level amounts to roughly −140 dBm/Hz at the predetermined resonance frequency. The noticeable switching noise at the proximity of 300 MHz mounts to roughly −138 dBm/Hz.

Figure 17:
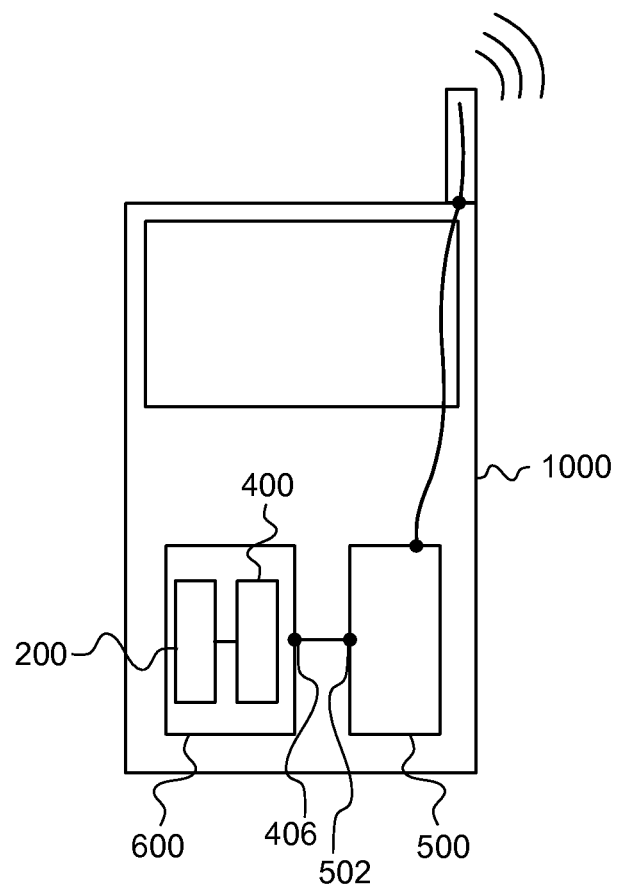
FIG. 17 shows an example of a mobile telecommunications device.

FIG. 17 schematically shows a mobile device or cellular phone comprising an example of a radio frequency amplifier circuit. That is, the mobile device 100 comprises an amplifier 500 which is powered by a power supply circuit 600 comprising an example of a controller 200 and a power supply 400. The amplifier 500 has a supply voltage input interface 502 which is coupled to the power output interface 406 of the power supply 400 controlled by a controller 200. Hence, envelope tracking may be performed without the insertion of additional noise into the spectrum of the amplifier 500 due to the use of controller 200 to control power supply 400.

In the following, examples pertain to further examples.

Example 1 is a controller for controlling a process variable. The controller comprises an input interface configured to receive a feedback signal indicative of an error between a process variable to be controlled and a setpoint for the process variable; at least a first integrator configured to derive an accumulated error signal using an integrator input signal depending on the feedback signal; at least one resonator having a predetermined resonance frequency, the at least one resonator being configured to provide a resonator output signal using a resonator input signal depending on the feedback signal; and an output interface configured to provide a manipulation signal for influencing the process variable, the manipulation signal being derived using the accumulated error signal and the resonator output signal.

In example 2, the subject matter of example 1 can optionally include that the manipulation signal is derived using a sum of signal components of the resonator output signal and of the accumulated error signal.

In example 2, the subject matter of example 1 or 2 can optionally include a first scaler configured to scale the feedback signal by a first scaling parameter to provide a first scaled feedback signal as a contribution to the integrator input signal.

In example 4, the subject matter of any of the preceding examples can optionally include the resonator comprising a second integrator having an output coupled to an input of a third integrator, and a feedback loop coupled between an output of the third integrator and an input of the second integrator, the feedback loop comprising at least a first feedback scaler configured to scale the signal of the output of the third integrator by a first feedback parameter.

In example 5, the subject matter of example 4 can optionally include a second scaler configured to scale the feedback signal by a second scaling parameter to provide a second scaled feedback signal as a contribution to a second integrator input signal of the second integrator.

In example 6, the subject matter of example 4 or 5 can optionally include a third scaler configured to scale the feedback signal by a third scaling parameter to provide a third scaled feedback signal as a contribution to a third integrator input signal of the third integrator.

In example 7, the subject matter of any of the preceding examples can optionally include a setpoint input interface configured to receive a setpoint signal indicative of the setpoint for the process variable.

In example 8, the subject matter of any of the preceding examples can optionally include a second resonator having a predetermined second resonance frequency the second resonator being configured to provide a second resonator output signal using a second resonator input signal depending on the feedback signal.

In example 9, the subject matter of example 8 can optionally include the second resonator comprising a fourth integrator having an output coupled to an input of a fifth integrator, and a feedback loop coupled between an output of the fifth integrator and an input of the fourth integrator, the feedback loop comprising at least a second feedback scaler configured to scale the signal of the output of the fifth integrator by a second predetermined feedback parameter.

Example 10 is a power supply circuit comprising an adjustable power supply having an power output interface configured to provide a present supply voltage and a control input interface configured to receive a control signal, wherein the present supply voltage depends on the control signal; and a controller according to any of the examples 1 to 9, the controller having its output interface coupled to the control input interface of the power supply for providing the manipulation signal of the controller as the control signal.

In example 11, the subject matter of example 10 can optionally include the power output interface of the power supply being coupled to the input interface of the controller so that an information on the present supply voltage is provided as a feedback signal to the controller.

In example 12, the subject matter of example 10 or 11 can optionally include a pulse width modulator for providing a pulse width modulation signal having a duty cycle depending on the control signal; and a driver circuit configured to provide a system supply voltage to the power output interface at time instants depending on the duty cycle.

In example 13, the subject matter of examples 10 to 13 can optionally include at least one capacitor coupled between the power output interface and a reference potential.

In example 14, the subject matter of example 13 can optionally include the controller comprising a further input interface configured to receive a further feedback signal indicative of an error between the process variable and the setpoint; and wherein the adjustable power supply is coupled to the further input interface such that the further feedback signal depends on a current traversing said at least one capacitor.

Example 15 is a method for controlling a process variable, the method comprising receiving a feedback signal indicative of an error between a process variable to be controlled and a setpoint for the process variable; deriving an accumulated error signal using an input signal depending on the feedback signal; deriving a resonator output signal using a resonator having a predetermined resonance frequency and a resonator input signal depending on the feedback signal; and deriving a manipulation signal for influencing the process variable, the manipulation signal being derived using the accumulated error signal and the resonator output signal.

In example 16, the subject matter of example 15 can optionally include deriving the manipulation signal comprising using a sum of signal components of the resonator output signal and of the accumulated error signal.

Example 17 is a radio frequency amplifier circuit comprising a power supply circuit according to any of examples 10 to 14; and an amplifier comprising a supply voltage input interface, the supply voltage input interface of the amplifier being coupled to the power output interface of the power supply circuit.

In example 18, the subject matter of example 17 can optionally include a signal input interface configured to receive a signal to be amplified; and a radio frequency output interface configured to provide an amplified representation of the signal received at the signal input interface.

Example 19 is a Mobile telecommunications device comprising a Radio Frequency Amplifier circuit according to examples 17 or 18.

In example 20, the subject matter of example 19 can optionally include an antenna coupled to the radio frequency output interface.

Example 21 is a machine readable medium including code to cause a machine to perform example 15 or 16 if the code is executed by the machine.

Example 22 is a computer program having a program code for performing example 15 or 16, when the computer program is executed on a computer or processor.

Example 23 is means for controlling a process variable, comprising means for receiving a feedback signal indicative of an error between a process variable to be controlled and a setpoint for the process variable; means for deriving an accumulated error signal using an input signal depending on the feedback signal; means for deriving a resonator output signal using a resonator having a predetermined resonance frequency and a resonator input signal depending on the feedback signal; and means for deriving a manipulation signal for influencing the process variable, the manipulation signal being derived using the accumulated error signal and the resonator output signal.

In example 24, the subject matter of example 23 can optionally include means for deriving a sum of signal components of the resonator output signal and of the accumulated error signal.

Example 25 is means for providing a supply voltage, comprising means for receiving a control signal and for providing a present supply voltage depending on the a control signal; and
means for controlling a process variable according to example 23 or 24 and for providing the manipulation signal as the control signal.

In example 26, the subject matter of example 25 can optionally include means for providing information on the present supply voltage as a feedback signal to the means for controlling a process variable.

Example 27 is means for amplifying a signal, comprising means for receiving the signal to be amplified; means for generating an amplified representation of the signal to be amplified using a supply voltage; and means for providing a supply voltage according to example 25 or 26.

In example 28, the subject matter of example 27 can optionally include means for providing the amplified representation of the signal.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. A controller for controlling a process variable, comprising:
   an input interface configured to receive a feedback signal indicative of an error between a process variable to be controlled and a setpoint for the process variable;
   at least a first integrator configured to derive an accumulated error signal using an integrator input signal depending on the feedback signal;
   at least one resonator having a predetermined resonance frequency, the at least one resonator being configured to provide a resonator output signal using a resonator input signal depending on the feedback signal; and
   an output interface configured to provide a manipulation signal for influencing the process variable, the manipulation signal being derived using the accumulated error signal and the resonator output signal.

2. The controller of claim 1, wherein the manipulation signal is derived using a sum of signal components of the resonator output signal and of the accumulated error signal.

3. The controller of claim 1, further comprising a first scaler configured to scale the feedback signal by a first scaling parameter to provide a first scaled feedback signal as a contribution to the integrator input signal.

4. The controller of claim 1, wherein the resonator comprises:
   a second integrator having an output coupled to an input of a third integrator, and
   a feedback loop coupled between an output of the third integrator and an input of the second integrator, the feedback loop comprising at least a first feedback scaler configured to scale the signal of the output of the third integrator by a first feedback parameter.

5. The controller of claim 4, further comprising:
   a second scaler configured to scale the feedback signal by a second scaling parameter to provide a second scaled feedback signal as a contribution to a second integrator input signal of the second integrator.

6. The controller of claim 4, further comprising a third scaler configured to scale the feedback signal by a third scaling parameter to provide a third scaled feedback signal as a contribution to a third integrator input signal of the third integrator.

7. The controller of claim 1, further comprising a setpoint input interface configured to receive a setpoint signal indicative of the setpoint for the process variable.

8. The controller of claim 1, further comprising a second resonator having a predetermined second resonance frequency the second resonator being configured to provide a second resonator output signal using a second resonator input signal depending on the feedback signal.

9. The controller of claim 8, wherein the second resonator comprises a fourth integrator having an output coupled to an input of a fifth integrator, and
   a feedback loop coupled between an output of the fifth integrator and an input of the fourth integrator, the feedback loop comprising at least a second feedback scaler configured to scale the signal of the output of the fifth integrator by a second predetermined feedback parameter.

10. A power supply circuit, comprising:
    an adjustable power supply having an power output interface configured to provide a present supply voltage and a control input interface configured to receive a control signal, wherein the present supply voltage depends on the control signal; and
    a controller according to any of claim 1, the controller having its output interface coupled to the control input interface of the power supply for providing the manipulation signal of the controller as the control signal.

11. The power supply circuit of claim 10, wherein the power output interface of the power supply is coupled to the input interface of the controller so that an information on the present supply voltage is provided as a feedback signal to the controller.

12. The power supply circuit of claim 10, wherein the power supply comprises:
    a pulse width modulator for providing a pulse width modulation signal having a duty cycle depending on the control signal; and
    a driver circuit configured to provide a system supply voltage to the power output interface at time instants depending on the duty cycle.

13. The power supply circuit of claim 10, further comprising at least one capacitor coupled between the power output interface and a reference potential.

14. The power supply circuit of claim 13, wherein the controller comprises a further input interface configured to receive a further feedback signal indicative of an error between the process variable and the setpoint; and
    wherein the adjustable power supply is coupled to the further input interface such that the further feedback signal depends on a current traversing said at least one capacitor.

15. A method for controlling a process variable, the method comprising:
    receiving a feedback signal indicative of an error between a process variable to be controlled and a setpoint for the process variable;
    deriving an accumulated error signal using an input signal depending on the feedback signal;
    deriving a resonator output signal using a resonator having a predetermined resonance frequency and a resonator input signal depending on the feedback signal; and
    deriving a manipulation signal for influencing the process variable, the manipulation signal being derived using the accumulated error signal and the resonator output signal.

16. The method of claim 15, wherein deriving the manipulation signal comprises using a sum of signal components of the resonator output signal and of the accumulated error signal.

17. A machine readable medium including code to cause a machine to perform the method of claim 15 if the code is executed by the machine.

\* \* \* \* \*